United States Patent [19]

Pelella et al.

[11] Patent Number: 5,504,362
[45] Date of Patent: Apr. 2, 1996

[54] ELECTROSTATIC DISCHARGE PROTECTION DEVICE

[75] Inventors: Mario M. Pelella; Ralph W. Young, both of Poughkeepsie; Giovanni Fiorenza, Stony Point; Mary J. Saccamango, Patterson, all of N.Y.

[73] Assignee: International Business Machines Corporation, Armonk, N.Y.

[21] Appl. No.: 306,532

[22] Filed: Sep. 14, 1994

Related U.S. Application Data

[63] Continuation of Ser. No. 494,739, Dec. 22, 1992, abandoned.

[51] Int. Cl.$^6$ ............................................. H01L 27/06
[52] U.S. Cl. ........................... 257/357; 257/361; 257/370
[58] Field of Search .................................... 257/357, 358, 257/370, 377, 360, 361

[56] References Cited

U.S. PATENT DOCUMENTS

| | | | |
|---|---|---|---|
| 4,692,781 | 9/1987 | Rountree | 357/23.13 |
| 4,745,450 | 5/1990 | Hartranft | 357/23.13 |
| 4,952,994 | 8/1990 | Lin | 357/23.13 |
| 5,017,985 | 5/1991 | Lin | 357/23.13 |
| 5,021,853 | 6/1991 | Kalzad | 357/23.13 |
| 5,124,775 | 6/1992 | Iranmanesh | 257/370 |
| 5,268,587 | 12/1993 | Murata et al. | 257/357 |

OTHER PUBLICATIONS

Thick Oxide Device ESD Performance UnderProcess Variations, R. A. McPhee, C. Duvvury, et al. 1986 EOS Synosium Proceedings, pp. 173–181.

The Elimination of Electrostatic Discharge Failures From Silicon Gate Logic Tech., R. B. Wilcox et al., EOS/ESD Symposium Proceedings, 1985, pp. 1–4.

A Summary Of Most Effective Electrostatic Discharge Protection Circuits For MOS Memories and Their Observed Failure Modes. C. Duvvury, et al. EOS/ESD Symposium Proceedings, 1983, pp. 181–184.

*Primary Examiner*—William D. Larkins
*Attorney, Agent, or Firm*—Duft, Graziano & Forest

[57] ABSTRACT

A thick-oxide ESD transistor for a BiCMOS integrated circuit has its source/drain contacts formed of the BiCMOS base or emitter polysilicon and its source/drain formed by an outdiffusion of the respective polysilicon contact. In one embodiment the BiCMOS resistor doping deepens the ESD source/drains, and in another embodiment the BiCMOS collector reach through doping deepens the ESD source/drains. The entire ESD transistor is fabricated from a standard BiCMOS process without any additional steps, has an area of about 100 square microns, can shunt up to 6000 volts, and has a turn-on time of about 10 picoseconds.

8 Claims, 7 Drawing Sheets

ELECTROSTATIC DISCHARGE PROTECTION DEVICE

This application is a continuation of application Ser. No. 07/994,739, filed Dec. 22, 1992, now abandoned.

BACKGROUND OF THE INVENTION

1. Field of the Invention

The invention in general relates to the electrostatic discharge (ESD) protection devices in integrated circuits, and more particularly to an ESD device fabricated in a BiCMOS integrated circuit process.

2. Statement of the Problem

It is well-known that integrated circuits are susceptible to damage from electrostatic discharges, commonly referred to as ESD, usually applied inadvevtently during handling. Thus almost all integrated circuits contain devices for protecting against excessive voltages as may be caused by ESD. It is well-known that a thick-oxide MOSFET operating as a parasitic lateral NPN bipolar transistor in second breakdown mode provides excellent ESD protection. See C. Duwury, R. N. Rountree, and L. S. White, "Summary of the Most Effective Electrostatic Discharge Protection Circuits For MOS Memories and Their Observed Failure Modes", EOS/ESD Symposium Proceedings, 1983, pp. 181–184; R. B. Wilcox and R. E. Douchette, "The Elimination of Electrostatic Discharge Failures From Silicon Gate Logic Technologies", EOS/ESD Symposium Proceedings, 1985, pp. 1–4; and R. A. McPhee, C. Duwury, R. N. Rountree, and H. Domingos, "Thick Oxide Device ESD Performance Under Process Variations", EOS/ESD Symposium Proceedings, 1986, pp. 173–181. Further, it is well-known to utilize a metallization layer in the MOSFET fabrication process to form the gate of a thick-oxide MOSFET and to utilize the field oxide to form the gate oxide. See U.S. Pat. No. 4,692,781 issued to Robert N. Rountree and Troy H. Herndon; U.S. Pat. No. 4,745,450 issued to Marc D. Hartranft and Keith A. Garret; and U.S. Pat. No. 4,952,994 issued to Chong M. Lin. All of the above patents recognize the efficiency of utilizing the steps of the fabrication process for creating the circuitry that is being protected to also create the devices for providing ESD protection, as for example the metallization and field oxide steps being used to create the thick-oxide ESD MOSFET. See also U.S. Pat. No. 5,021,853 issued to Kaizad R. Mistry which discloses utilizing the polysilicon gate of the protected devices to make the gate of the protective device. In addition, the Hartranft patent cited above discloses utilizing the same diffusion that is used to form resistors in the protective circuit to form the source/drains of the ESD MOSFET.

A problem in fabricating an ESD MOSFET is that the ESD device must be capable of handling much higher voltages and currents than the devices in the protected circuitry. A principle failure mode of ESD MOSFETs is electrothermomigration of materials at the drain contacts or even melting of the drain contacts due to the heat generated by the high currents. In order to avoid such problems, in fabricating the protective transistor, all of the references cited above, except perhaps the Rountree patent, use one or more additional process steps, beyond the steps already utilized in-fabricating the protected circuitry. For example, the Lin patent cited above discloses forming deep wells about the conventional source/drains to enable the protective transistor to handle larger currents, which deep wells are formed in a separate step from the conventional source/drains.

A principal thrust of integrated circuit technology is to make individual components of the integrated circuit smaller so as to obtain the advantages of less bulk, greater reliability, and faster response times. As integrated circuits become smaller, the distances between conductors and the thicknesses of insulating layers in transistors, capacitors and other electronic components in the individual IC devices become smaller, increasing the need for ESD protection. However, while the importance of the ESD protective devices being as compact as possible is recognized in all of the above references, all of the protective devices disclosed take up substantially more area than the corresponding devices in the protected circuitry. For example both the Rountree and Mistry patents cited above disclose making the distance between the transistor channel and drain contact three or more times larger in the ESD transistor than the protected transistor in order to prevent the drain contact melting problem mentioned above. Structures that can handle large voltages, in the range of 6000 volts, such as the device of the Rountree patent, cover several hundred square microns. Such a large size is not compatible with objective of ever-smaller integrated circuits. Further, these large ESD devices have turn-on times that are relatively slow. The faster the turn-on time of an ESD protective device, the less chance there is that an ESD voltage will build up to a significant level before the device turns on. As integrated circuits become ever more susceptible to damage from excess voltages, it becomes more important that the turn on time for the ESD devices be improved.

Thus, there is a need for an ESD transistor structure that is of the order of tens of square microns, has faster turn-on times, and the fabrication process for which requires no extra fabrication steps in addition to those already utilized in fabricating the protected circuit.

All of the references cited above disclose MOSFET ESD devices which are fabricated utilizing CMOS or MOS technology. Generally in bipolar technology the ESD devices of the prior art are diodes. In recent years the requirements of advanced technology have given rise to new fabrication processes such as BiCMOS, which combines both bipolar and CMOS devices on a single chip. A structure and process for fabricating ESD protective thick-oxide transistors that utilizes the BiCMOS technology and at the same time solves the problems outlined above would be highly desirable.

3. Solution to the problem

The present invention solves the above problems by providing a thick-oxide FET that is fabricated using only the process steps which are already used in state-of-the-art BiCMOS technology. The FETs occupy areas in the integrated circuit on the order of tens of square microns and have turn-on times significantly faster than prior art ESD devices that are capable of handling large voltages.

The invention impedes the drain contact melting by utilizing polysilicon as the source/drain contact. In one embodiment the invention utilizes the polysilicon of the base contact in the standard double-poly BiCMOS process to make the ESD transistor source/drain contacts. In another embodiment the invention utilizes the polysilicon of the emitter contact in the standard BiCMOS process to make the ESD transistor source/drain contacts.

The use of polysilicon for the source/drain contacts permits the creation of an outdiffusion into the source/drain which improves the ohmicity of the contact, thereby further enabling the ESD FET to handle large currents, which further reduces the heating problem.

The invention also addresses the problem of handling large currents without unduly increasing the area occupied by the ESD device by utilizing a standard BiCMOS process to create source drain regions that are much deeper than the ESD source/drains of the prior art. In one embodiment the resistor diffusion is used to make an enlarged well about the source/drain outdiffusion. In another embodiment the collector reach through doping of the BiCMOS process is used to make deep source/drain wells that can handle substantially increased current as compared to the prior art.

The invention further solves the high current problem by utilizing the deep wells characteristic of the portion of the BiCMOS process in which the CMOS transistors are fabricated to form a deep base for the parasitic bipolar transistor that, in combination with the deep sources and drains discussed above, increases the current handling capability of the parasitic transistor. In one embodiment the N-well of the P-channel CMOS transistor is use to form the base of a parasitic PNP bipolar transistor, and in another embodiment the P-well of the N-channel CMOS transistor is used to form the base of a parasitic NPN bipolar transistor.

The above features of the invention result in ESD devices that have areas of only about 10 to 100 square microns, have turn on times of on the order of 10 picoseconds, and yet are capable of handling charges as high as 6000 volts.

SUMMARY OF THE INVENTION

The invention provides an ESD device for protecting circuitry in a BiCMOS integrated circuit, the protected circuitry fabricated utilizing a plurality of BiCMOS integrated circuit fabrication process steps, wherein the ESD device is formed entirely by the BiCMOS integrated circuit fabrication processes utilized in fabricating the protected circuitry and occupies an area of less than 100 square microns. Preferably, the BiCMOS integrated circuit protected circuitry includes a plurality of BiCMOS integrated circuit layers and a plurality of BiCMOS integrated circuit dopings, and wherein the ESD device is made entirely of one or more of the BiCMOS integrated circuit layers and one or more of the BiCMOS integrated circuit dopings utilized in the protected circuitry. Preferably, the BiCMOS integrated circuit protected circuitry includes a base contact polysilicon layer, the ESD device includes a source contact and a drain contact, and one of the source contact and the drain contact comprises a portion of the base contact polysilicon layer. Alternatively, the BiCMOS integrated circuit protected circuitry includes an emitter contact polysilicon layer, the ESD device includes a source contact and a drain contact, and one of the source contact and the drain contact comprises a portion of the emitter contact polysilicon layer. Preferably, the ESD device includes a source and a drain, and one of the source and the drain comprises an outdiffusion doping from its contact. Preferably, the BiCMOS integrated circuit protected circuitry includes a reach through collector doping, the ESD device includes a source contact and a drain contact, and one of the source contact and the drain contact is comprised of the reach through collector doping.

In another aspect the invention provides an ESD device for a BiCMOS integrated circuit having a silicon layer, a CMOS FET comprising a well region formed in the silicon layer having a first doping of a first polarity and a FET source and a FET drain in the silicon layer comprising a second doping of a second polarity, a bipolar transistor with a base, an emitter, a collector, a base contact comprised of a portion of a base contact layer, an emitter contact comprised of a portion of an emitter contact layer, a set of interconnection layers connecting elements of the integrated circuit and being separated from the silicon layer and from one another by a set of interlayer dielectrics, the FET and bipolar transistor having a greatest device threshold $V_{tm}$ and a device voltage limit $V_L$, the ESD device having a turn-on voltage threshold $V_{to}$ and a punch-through threshold $V_{pt}$ greater than the $V_t$ and less than the $V_L$, the ESD device comprising: an ESD well region comprised of the first doping having the first polarity; an ESD source contact and an ESD drain contact comprised of a portion of one of the base and emitter contact layers; an ESD source comprising an outdiffusion of the ESD source contact and the ESD drain comprising an outdiffusion of the ESD drain contact; an ESD gate insulator comprising a portion of one or more of the set of interlayer dielectrics; and an ESD gate comprising a portion of one of the set of interconnection layers; whereby the ESD device is formed from device elements from both CMOS and bipolar structures of the integrated circuit. Preferably, the ESD source contact and ESD drain contact comprise a portion of the base contact layer. Alternatively, the ESD source contact and ESD drain contact comprise a portion of the emitter contact layer. Preferably, the CMOS FET is a PFET and the first polarity doping is N type. Alternatively, the CMOS FET is an NFET and the first polarity doping is P type. Preferably, the BiCMOS process further includes a resistor doping in the silicon layer and the ESD source and ESD drain further comprises a portion of the resistor doping forming a well about the contact outdiffusion. Preferably, the bipolar transistor collector comprises a deep reach through doping in the silicon layer and the ESD source and ESD drain further comprises a portion of the deep reach through doping forming a well about the contact outdiffusion.

In a further aspect, the invention provides an ESD thick-oxide device for an integrated circuit having a silicon layer, a set of interconnection layers connecting elements of the integrated circuit and being separated from the silicon layer and from one another by a set of interlayer dielectrics, the ESD device of the type having a gate comprising a portion of one of the interconnection layers, a gate oxide comprising a portion of one or more of the interlayer dielectrics, an ESD source and an ESD drain in the silicon layer, an ESD source contact contacting the ESD source, and an ESD drain contact contacting the ESD drain, wherein at least one of the ESD source contact and the ESD drain contact comprises polysilicon. Preferably, the integrated circuit includes a base contact polysilicon layer and the at least one ESD contact comprises a portion of the base contact polysilicon layer. Alternatively, the integrated circuit includes an emitter contact polysilicon layer and the at least one ESD contact comprises a portion of the emitter contact polysilicon layer.

In yet a further aspect, the invention provides an ESD thick-oxide device for an integrated circuit having a silicon layer, a collector in the silicon layer comprising a reach through collector doping, a set of interconnection layers connecting elements of the integrated circuit and being separated from the silicon layer and from one another by a set of interlayer dielectrics, the ESD device of the type having a gate comprising a portion of one of the interconnection layers, a gate oxide comprising a portion of one or more of the interlayer dielectrics, and an ESD source and an ESD drain in the silicon layer, wherein at least one of the ESD source and the ESD drain comprises a portion of the reach through collector doping in the silicon layer. Preferably, the integrated circuit further includes a subcollector doping in the silicon layer and the one of the ESD source and the ESD drain further comprises a portion of the subcollector doping in the silicon layer. Preferably, the integrated circuit further comprises a FET having a well region in the silicon layer, the well region comprising a first doping having a first polarity, and the ESD device further comprises a base of a parasitic bipolar transistor, the base comprising a portion of the first doping.

The invention not only provides an ESD device that solves the high current problems of prior art devices and can be fabricated without additional steps utilizing a state-of-the-art BiCMOS process, but the device can also be fabricated as an NFET or PFET and portions of the devices can be adjusted within the standard fabrication processes to provide great flexibility in design with respect to threshold voltage, punch-through voltage, and general voltage and current handling capacity. Numerous other features, objects and advantages of the invention will become apparent from the following description when read in conjunction with the accompanying drawings.

DESCRIPTION OF THE PREFERRED EMBODIMENT

1. Overview

Figure 1:
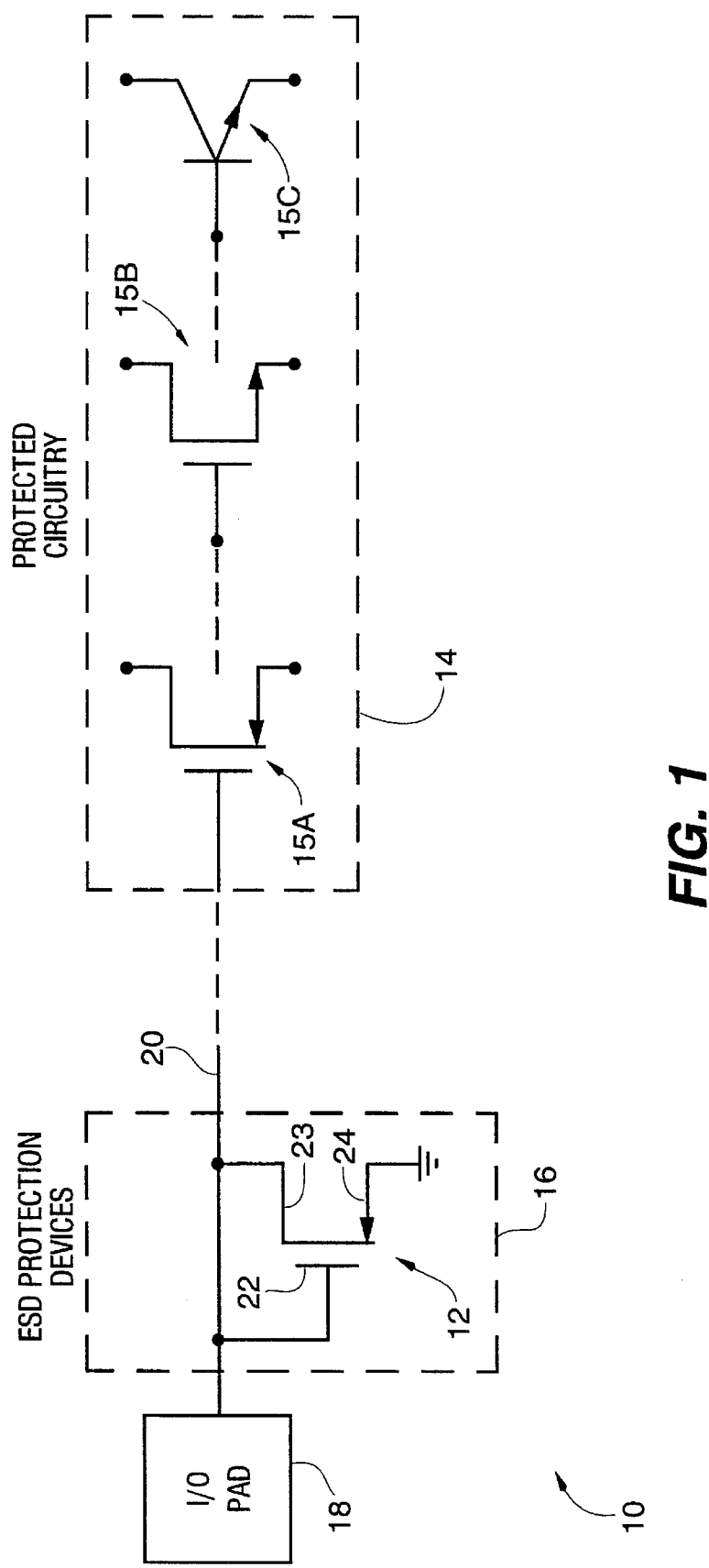
FIG. 1 is a block circuit diagram illustrating connection of the ESD protection device between the input/output pad and the protected circuitry of an integrated circuit.

Turning now to FIG. 1, a semi-block diagram of an integrated circuit 10 is shown illustrating an ESD protective device 12 according to the invention and its interconnection within the integrated circuit 10. The integrated circuit 10 includes protected circuitry 14, ESD protection devices 16, and an input/output pad 18. The protection circuitry 16 is connected to line 20 which connects input/output pad 18 to the protected circuitry 14. The protected circuitry 14 may be a memory, such as a DRAM or SRAM, a counter, a buffer, or any other circuit that may be fabricated as an integrated circuit. It may contain a variety of individual electronic components. An N-channel FET 15A, a P-channel FET 15B, and an NPN bipolar transistor 15C are shown in order to illustrate the fact that the line 20 will in general be connected to an element, such as the gate of transistor 15A, which may be damaged if voltages higher than its design voltage are applied. Generally the protected circuitry will also contain other devices; it need not contain all of the types of transistors 15A, 15B, and 15C shown in FIG. 1. Each of the transistors, such as 15A, or other components of protected circuitry 14 may have a threshold voltage $V_t$ at which it turns on and the greatest of these voltages will be the maximum threshold voltage $V_{tm}$ of the circuitry 14. There will also be a voltage $V_L$ at which one or more of the devices in the circuitry 14 will fail.

Turning to the protection devices 16, generally there will be a variety of protection devices 16 connected to line 20, including one or more which shunt ESD charge to the ground or logic 0 voltage $V_{ss}$, and one or more which shunt ESD charge to the high or logic 1 voltage $V_{dd}$. As is well known in the art, the selection of the various protection devices 16 and their interconnection is designed to shunt any probable ESD charges, including both negative and positive charges. This invention is related to the structure and fabrication of the individual devices, such as 12, and thus the protection circuit 16 will not be discussed in detail.

In the preferred embodiment of the invention, the protection devices 16 include a thick-oxide, punch-through MOSFET device 12. In the embodiment shown in FIG. 1 transistor 12 is a PFET having its gate 22 connected to its drain 23 and its source grounded. When a positive ESD having a voltage higher than the threshold voltage $V_{to}$ of transistor 12 is applied to line 20, transistor 12 will turn on and conduct the ESD charge to ground. The transistor 12 can also operate in punch-through mode in which the ESD charge punches through from the drain 23 to source 24. Generally this occurs if the ESD charge rises sufficiently fast that the voltage on line 20 reaches the punch-through threshold voltage $V_{pt}$ before the gate 22 is charged sufficiently to turn transistor 12 on. As will be discussed in more detail later, the thick-oxide device 12 also includes a parasitic bipolar transistor 26, 76 (FIG. 2), and in fact, as will be discussed further below, this bipolar mode will generally dominate. Each of the protection devices, such as transistor 12, are designed so that its turn-on voltage threshold Vto and its punch-through threshold Vpt are greater than the maximum threshold voltage $V_{tm}$ and less than the device voltage limit $V_L$ of the protected devices 14.

2. Detailed Description of the Structure and Fabrication of the ESD Devices

Figure 2:
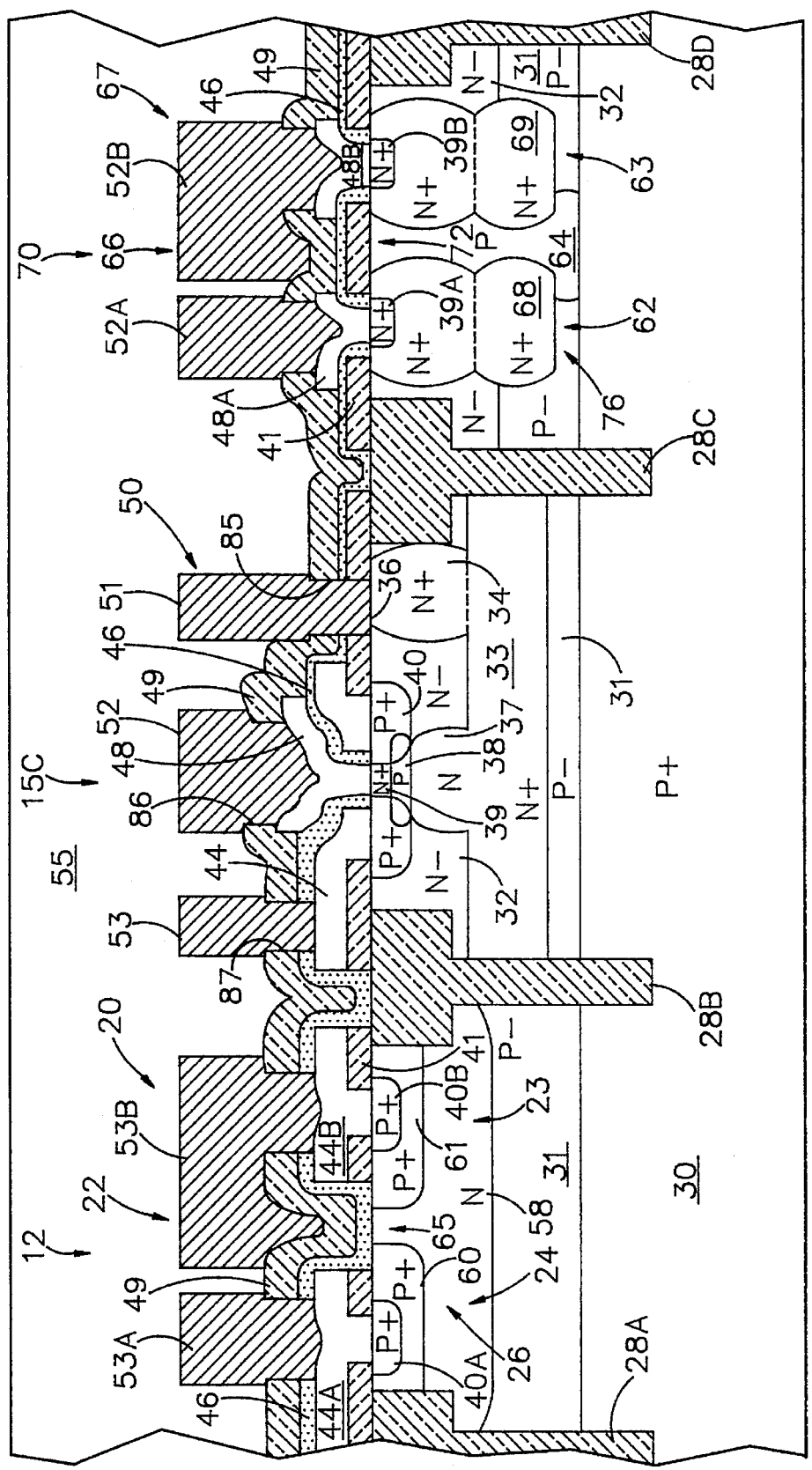
FIG. 2 is a cross-sectional view of an idealized portion of an integrated circuit chip illustrating an NPN transistor fabricated according to a standard BiCMOS process and an NFET and a PFET thick-oxide transistor according to the invention.

Turning to FIG. 2, a cross-sectional view of a preferred embodiment of an integrated circuit wafer 10 according to the invention is shown. It should be understood that the figures are not meant to be actual cross-sectional views of any particular portion of an actual integrated circuit, but are merely idealized representations which are employed to more clearly and fully depict the process of the invention than would otherwise be possible. The cross-sectional view in FIG. 2 in particular is constructed to show a typical NPN bipolar transistor 15C, generally the structure between isolation oxide 28B and 28C, illustrating the bipolar portion of the BiCMOS structure and process, a thick-oxide punch-through transistor PFET transistor 12, generally the structure between isolation oxide 28A and 28B, illustrating one preferred embodiment of the invention, and a thick-oxide punch-through NFET transistor 70, generally the structure between isolation oxide 28C and 28D, illustrating another preferred embodiment of the invention. In an actual integrated circuit these three transistors 12, 15C, and 70 would not be so located, but rather would be arranged as shown in FIG. 1, with the PFET 12 and NFET 70 included with the ESD protection devices 16 at the periphery of the chip and the bipolar transistor 12 located in the protected device circuitry 14. In addition to the bipolar transistor 15C, the integrated circuit 10 also may include other bipolar devices and will include CMOS devices which are not shown in the cross-section of FIG. 2 except, as will be discussed below, insofar as several CMOS elements are used in the PFET 12 and NFET 70. Such other bipolar and CMOS devices are conventional and will not be discussed further herein.

The NPN bipolar transistor preferably includes a P+ doped silicon substrate 30, a P− doped silicon epitaxial layer 31 and an N− doped silicon epitaxial layer 32. Deep isolation silicon oxide regions 28A through 28D separate the devices on the wafer 10. An oxide layer 41 is formed on the surface 36 of the silicon layers, a base P+ doped polysilicon contact layer 44 is formed on the oxide 41, followed by an interpoly oxide layer 46, an emitter N+ doped polysilicon layer 48, and another oxide layer 49. Metallization layers 50 form the collector contact and interconnection line 51, the emitter interconnection line 52, and the base interconnection line 53. A passivation oxide or glass 55 caps the wafer 10. Returning to the various dopings of the silicon layers 30, 31, and 32, an N+ doped subcollector region 33 extends across the interface between the P− and N− epitaxial regions 31 and 32. An N+ collector reach-through doped region 34 extends from the subcollector region 33 to the silicon surface 36 under the collector contact 51. The epitaxial layer 32 also includes an N doped collector region 37, a P+ doped intrinsic base region 38, an N+ doped outdiffusion from emitter contact 48, and a P+ outdiffusion 40 from base contact 44. The NPN transistor 15C also includes other conventional layers and dopings, such as a thin silicide layer between metal lines 51, 52 and 53 and their respective contacts 34, 48 and 44; however these other layers and dopings are well-known and are not shown for clarity. The above-described bipolar NPN transistor is a state-of-the-art bipolar transistor that is well-know in the literature, and thus does not need to be described in further detail.

Thick-oxide punch-through PFET 12 includes the same P+ silicon substrate 30, P− epitaxial layer 31 and N− epitaxial layer 32 as bipolar transistor 15C, however an N doping 58 used to form the N well for the CMOS P channel FETs 15A dominates the N− doping and thus the region 58 is shown as an N well. The source contact 44A and the drain contact 44B of the PFET 12 are formed from the P+ base polysilicon 44. A P+ outdiffusion 40A from the source contact 44A and a P+ well 60 formed in the same step as the BiCMOS resistor diffusion forms the source 24, while the corresponding outdiffusion 40B from drain contact 44B and a corresponding P+ well 61 forms the drain 23. The source contact interconnection 53A is formed from the same metal interconnection layer as the NPN transistor 15C base interconnection 53. The connection line 20 to drain 23 and the gate 22 of PFET 12 is formed from a single section 53B of the same metallization layer as the base interconnection 53 of the NPN transistor 15C. The gate oxide 65 is formed from the interlayer dielectrics 46 and 49. In the process of forming the PFET 12, a parasitic PNP bipolar transistor 26 is formed from the source 24, which is the emitter of the parasitic PNP 26, the N well 58 which forms the base of the parasitic PNP 26, and the drain 23 which forms the collector of the parasitic PNP transistor 26.

Another preferred embodiment of a thick-oxide punch-through MOSFET protective transistor is an NFET 70 shown at the right in FIG. 2. This NFET 70 also is formed on the same P+ silicon substrate 30, P− epitaxial layer 31, and N− epitaxial layer 32. A P well 64 is formed in a CMOS process that is used to form the P wells for N channel FET 15B in the BiCMOS protected circuitry 14. Here the source contact 48A and the drain contact 48B are formed from the N+ emitter polysilicon layer 48. The source 62 is formed from an outdiffusion 39A from the source contact 48A, corresponding to the emitter outdiffusion 39 of the NPN transistor 15C, and a deep. N+ well 68 about the outdiffusion 39A, which well 68 is formed in the same process as the NPN subcollector doping 33 and reach-through collector doping 34. Likewise drain 63 is formed from drain contact outdiffusion 39B and well 69 which is also formed in the same process as the NPN subcollector doping 33 and reach-through collector doping 34. The gate 66 of NFET 70 and the drain interconnector 67 are formed from a single section 52B of the metal interconnection layer 52 which forms the emitter interconnection of the NPN 15C. Likewise the source interconnector 52A is made from a section of the same metallization layer 52 that forms emitter interconnection of the NPN 15C. The gate oxide 72 is formed from the interlayer dielectrics 41, 46 and 49.

Figure 3A:
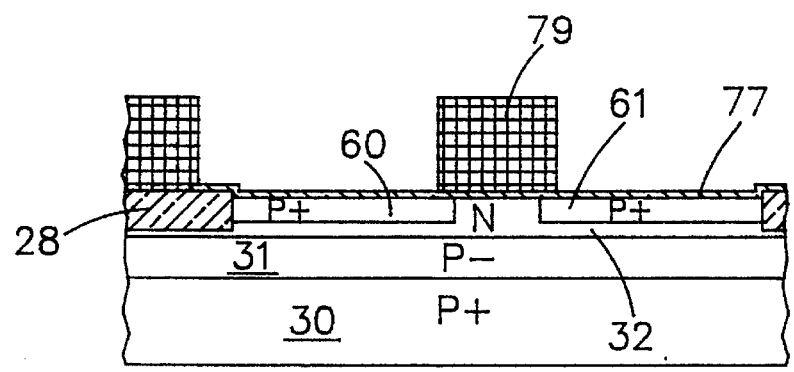
FIGS. 3A through 3F are cross-sectional views of a portion of an integrated circuit chip according to the invention illustrating the fabrication process of a thick-oxide PFET according to the invention.
Figure 3B:
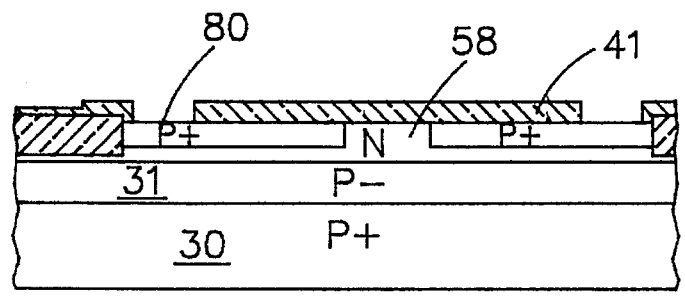
Figure 3C:
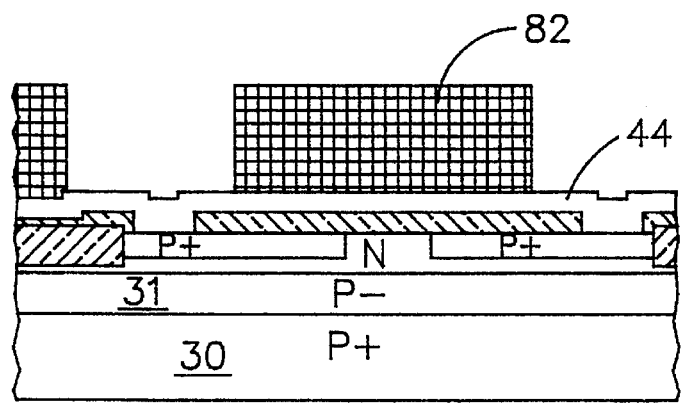
Figure 3D:
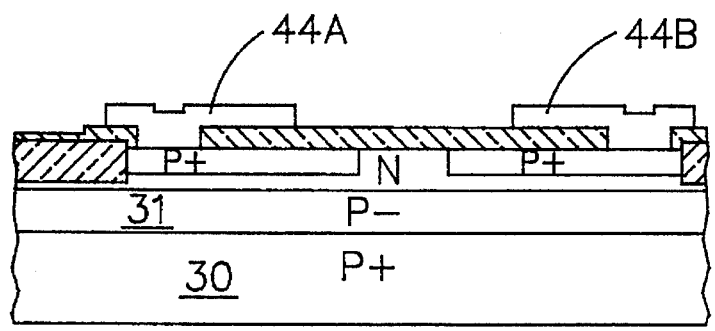
Figure 3E:
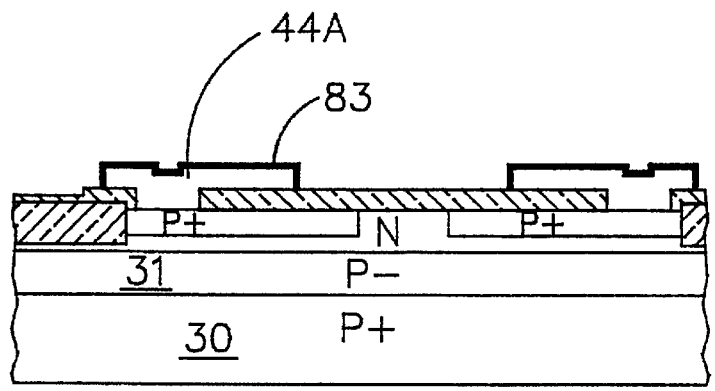
Figure 3F:
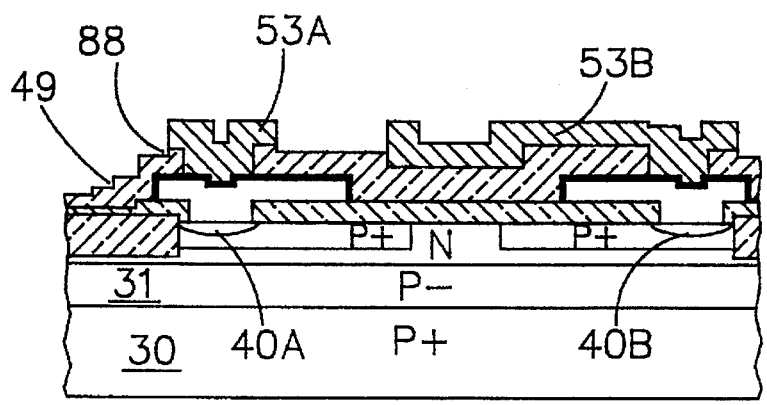
Figure 4A:
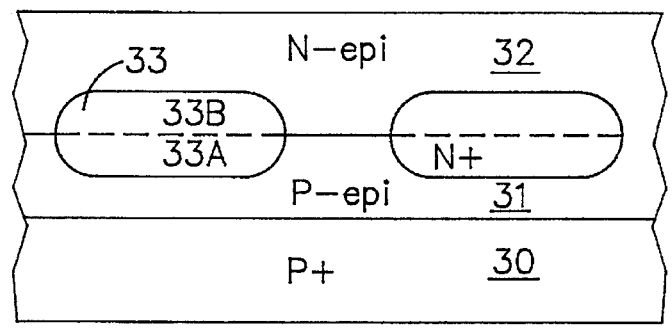
FIGS. 4A through 4C are cross-sectional views of a portion of an integrated circuit chip according to the invention illustrating the fabrication process of a thick-oxide NFET according to the invention.
Figure 4B:
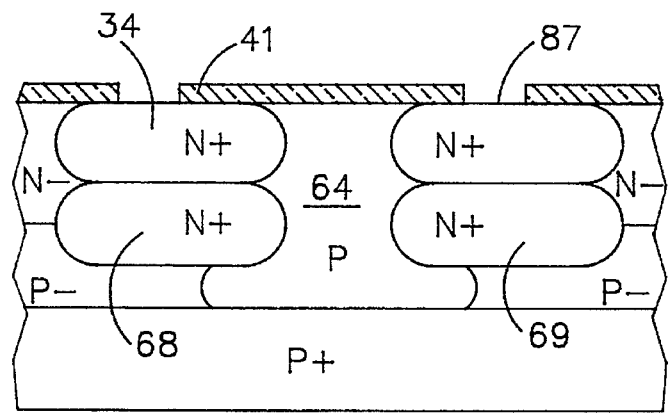
Figure 4C:
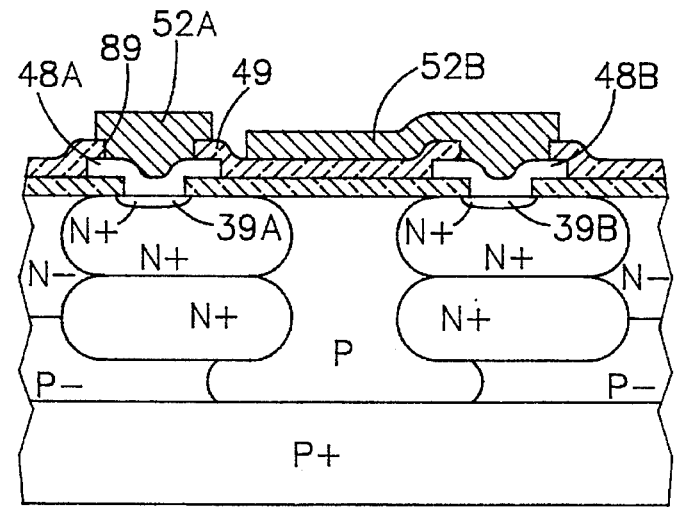

Turning now to FIGS. 3A through 3F and 4A through 4C, the preferred embodiment of the process for fabricating the thick-oxide PFET 12 and thick oxide NFET 70 according to the invention is shown. The process is the same as that for forming the BiCMOS transistors 15A, 15B, and 15C thus we shall refer also to FIG. 2 in this discussion. In FIG. 4A the P− epitaxial layer 31 has been formed on the P+ substrate and an N+ subcollector implant has been formed in its surface by doping selected areas 33A during the epitaxial growth or other conventional method. The N− epitaxial layer 32 is then grown, and during this process the doped areas 33A grow into the areas 33B to form the N+ subcollector regions 33. Deep trenches may then be etched and oxidized to form the isolation regions 28A, 28B, 28C, and 28D (FIG. 2). Turning to FIG. 3A, in the area of the PFET the subcollector regions have not been formed since the P− epitaxial layer is not doped in this region. Also the isolation regions 28 are shown as shallower since those as deep as shown in FIG. 2 are not necessary for this device. After the growth of the N− epitaxial layer 32, a thin oxide layer 77 is formed on the silicon surface, and a resist layer 79 is deposited and patterned with a photo mask and etch. Then the P+ resistor ion implant step is performed to form wells 60 and 61. The resist is then stripped and another series of resist deposition and photo mask and etch steps are performed followed by an N+ ion implant to form the deep reach through areas 34 (FIG. 4B). Then another resist deposition, photo mask, and etch followed by a P− implant forms the P well 64. Then, turning to FIG. 3B, another resist deposition, photo mask, and etch followed by a N type ion implant is performed to form the N well 58. Then the oxide layer 41 is formed and the base contact etch is performed to form the contact wells 80. An NPN collector N type implant may then be done over the entire area of the transistors to assist in suppressing vertical punch-through from the P+ areas 40, 40A, 40B (FIG. 2) through the N type layers to the P− epitaxial layer. This implant is optional. Directing attention to FIG. 3C, the base polysilicon layer 44 is deposited and resist layer 82 is deposited and patterned with a photo mask and etch step. The base ion P+ ion implant is then performed, the resist 82 is stripped, and the base etch resist is deposited and patterned in a photo mask step, the base etched, and the resist stripped to form the base contacts 44 and the source and drain contacts 44A and 44B (FIG. 3D). Turning to FIG. 3E, a silicide layer 83 is formed to increase the ohmicity of the contact between the polysilicon contacts 44, 44A, 44B and the metallization to follow. The interlayer dielectric silicon oxide 46 is then formed which is shown distinct from the oxide 41 in FIG. 2, but shown combined with the oxide 41 in FIG. 4C as it would be in an actual device. The NPN emitter contact openings 87 are then etched in another mask process, which also forms the openings for source contact 48A and drain contact 48B of the NFET 70. Turning to FIGS. 2 and 4C, the polysilicon emitter contact layer 48 is deposited. After another resist deposition and photo mask step, the N+ polysilicon ion implant is then performed, the resist stripped, another resist layer is deposited and patterned, and the emitter poly is etched to form the emitter contact 48 and the source contact 48A and drain contact 48B of thick-oxide NFET 70. Then follows a heating step to drive in the P+ and N+ dopings and form outdiffusions 40A, 40B, 39, 40, 39A and 39B. Then the silicon oxide interlayer dielectric 49 is formed. In the structure of the PFET 12 in FIG. 2, the dielectric layers 46 and 49 are distinguished, however in FIG. 3F they are merged into one as they would be in an actual device. The contact openings 85, 86, and 87 (FIG. 2) are then etched after another resist and photo mask process, which also forms the polysilicon contact openings 88 (FIG. 3F) of the PFET and 89 (FIG. 4C) of the NFET. Then follows the deposition of the metallization followed by another resist deposition, photo mask and etch to pattern the interconnects 51, 52, 53, 52A, 52B, 53A and 53B (FIGS. 2, 3F, and 4C). Finally the passivation layer 55 is deposited to complete the wafer 10.

Figure 5A:
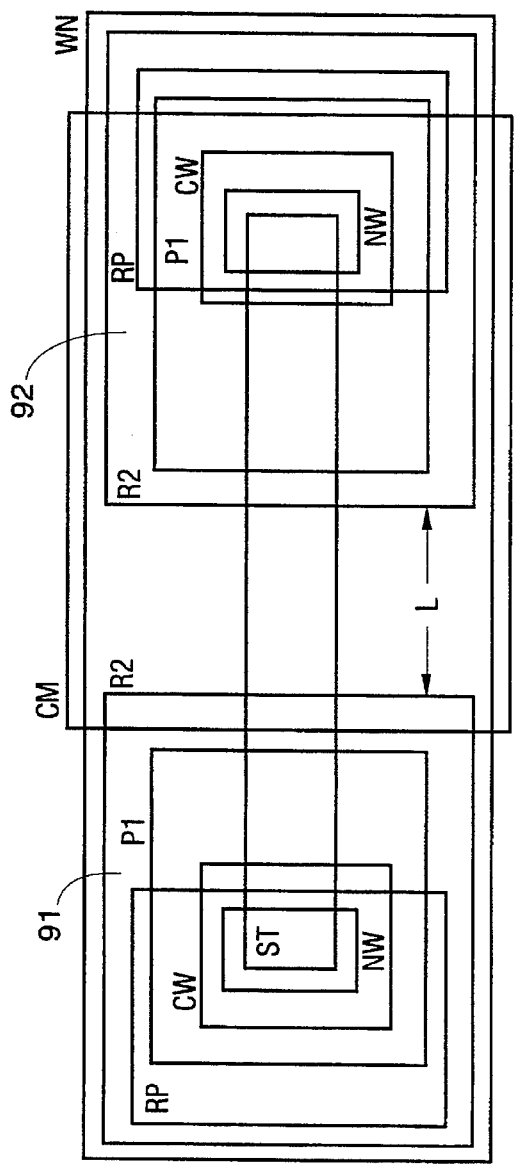
FIG. 5A is a layout of a more realistic PFET according to the invention.
Figure 5B:
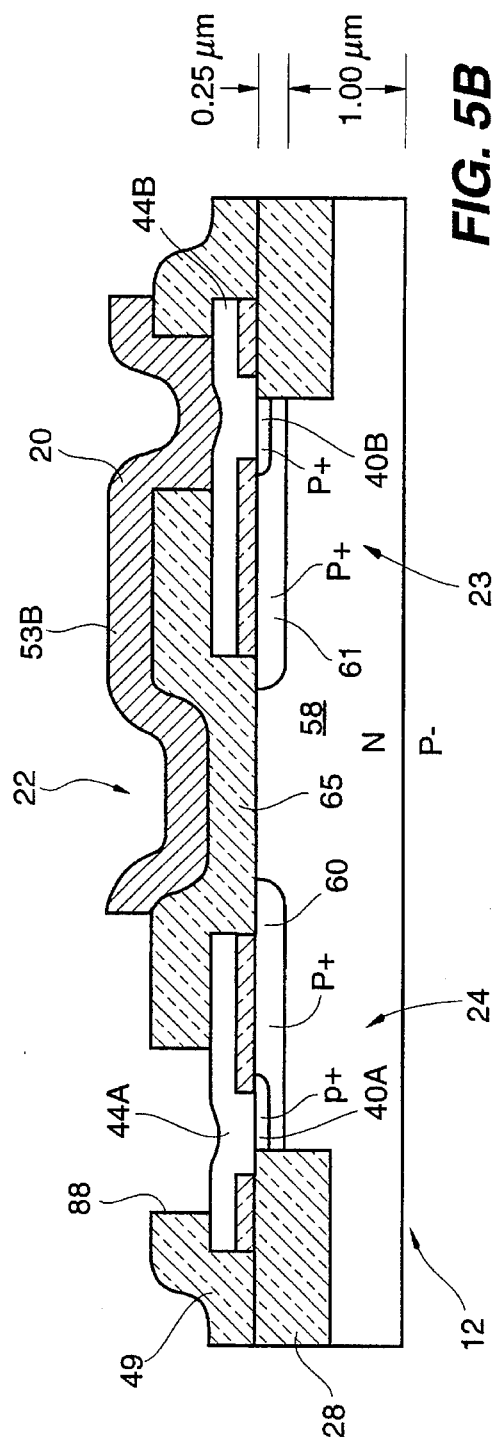
FIG. 5B is a cross-sectional view of a PFET corresponding to the layout of FIG. 5A.

In FIGS. 2 through 4C the relative thicknesses of the various layers were in some instances greatly distorted in order to illustrate the integrated circuit 10 within the constraints of the drawings. A more realistically proportioned cross-section of the PFET 12 is shown in FIG. 5B with the relative depths of the N well 58 and the P+ wells 40A and 40B shown at the left as 1.00 micron and 0.25 micron respectively. In FIG. 5A, a layout of the various masks used to form the various elements is shown, aligned with cross-section of FIG. 5B so that the parts that are formed with each mask can be more easily identified. The mask ST defines the shallow trench 28 or conversely, the area of the silicon 58 on which the ESD device is formed. The mask NW defines the NPN base windows, and at the same time the area where the source/drain contacts 44A and 44B of the ESD device contact their respective source/drains 24, 23. The mask CW defines contact window 88, the mask P1 defines the poly one layer, that is the contacts 44A and 44B, the mask RP defines the P+ implant for the contacts 44A and 44B, the mask R2 defines the resistor P+ dopings 60 and 61, the mask CM defines the gate and contact metallization 53B, and the mask WN defines the N well implant 58.

The materials from which the integrated circuit according to the invention is made have been reviewed above insofar as they are applicable to the invention. Otherwise the materials used are those of the state-of-the-art BiCMOS integrated circuit which is well-known in the art.

It is a feature of the thick-oxide punch-through transistors 12, 70 according to the invention that they operate in three different modes. The first mode is the MOSFET transistor mode in which a gate-source voltage at or above the threshold voltage turns the transistor on allowing current to flow from the source 24, 62 to the drain 23, 63. The second mode is the punch-through mode in which the drain-source voltage increases to the point where current punches through from the source 24, 62 to the drain 23, 63. The third mode is the bipolar transistor mode in which current flowing into the base 58, 64, causes the parasitic bipolar transistor 26, 76 to turn on allowing current to flow from the emitter 24, 62, to the collector 23, 63. Which mode dominates depends on the rise time of the ESD voltage and to a lesser extent on the voltage value. In most instances the bipolar mode will dominate.

Figure 6:
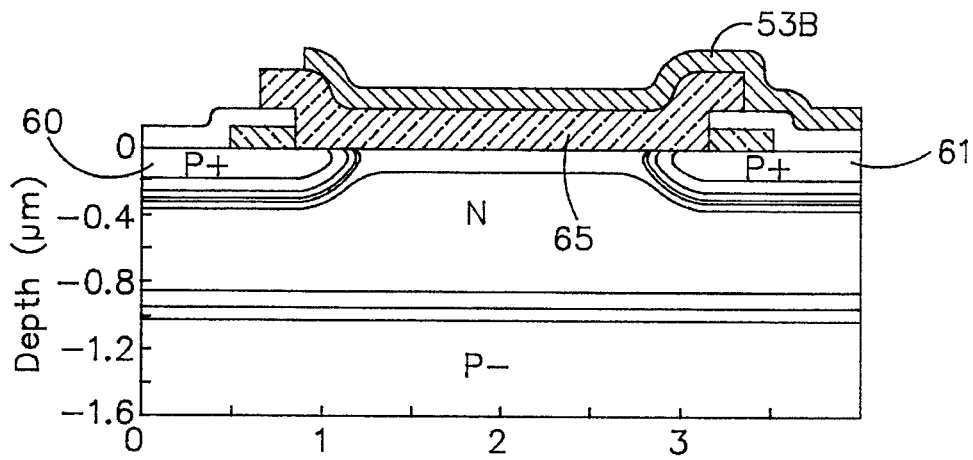
FIG. 6 is a numerical simulation of the PFET of FIG. 5B showing how the source/drain diffusion depth and area may be varied to determine the threshold voltage and punch-through voltage of the device.
Figure 7:
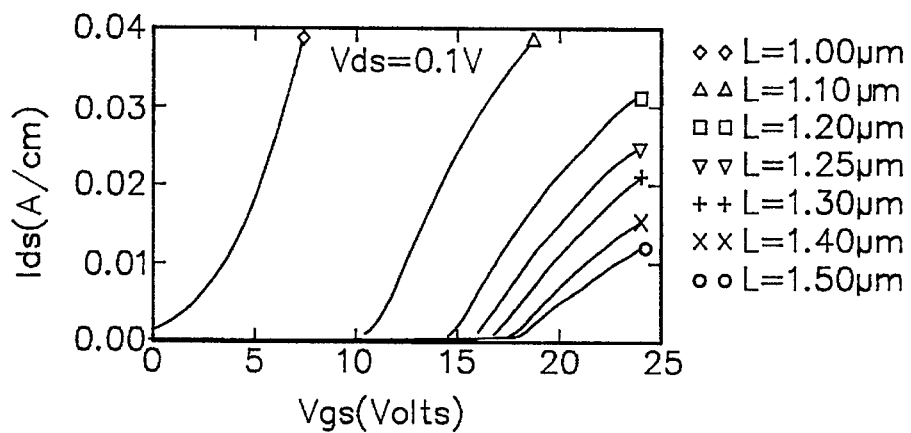
FIG. 7 is a graph of the gate-source voltage versus drain-source current for PFET numerical simulations of FIG. 6 illustrating how the threshold voltage varies with gate length, L.

In FIG. 6 a numerical simulation of the PFET of FIG. 5B showing how the diffusion depth and area of the source 60 and drain 61 may be varied to choose the threshold voltage and punch-through voltage of the device. FIG. 7 is a graph of the gate-source voltage versus drain-source current for PFET numerical simulations of FIG. 6, with a drain-source voltage of 0.1 volts, illustrating how the threshold voltage varies with gate length, L. The gate length, L, is defined as the distance between the openings 91 and 92 in the R2 mask as shown in FIG. 5A. For a gate length of 1.00 micron, the depletion region extends nearly across the gate region so that current flows as soon as a voltage is applied. For a gate length of 1.10 micron, the threshold voltage is about ten volts. The threshold voltage increases to about 15 volts for a gate length of 1.20 microns, and then increases relatively slowly, being at about 18 volts for a gate of 1.50 microns.

Figure 8:
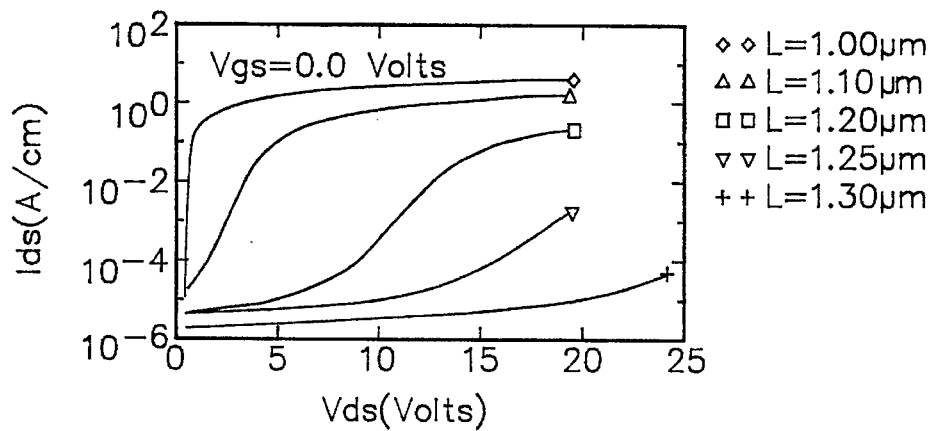
FIG. 8 is a graph of the drain-source voltage versus drain-source current for the PFET numerical simulations of FIG. 6 illustrating how the punch-through voltage varies with gate length.

FIG. 8 is a graph of the drain-source voltage versus drain-source current for the PFET numerical simulations of FIG. 6, with a gate-source voltage of 0.0 volts, illustrating how the punch-through voltage varies with gate length. What is considered to be a punch-through current depends upon the application. For some purposes, even $10^{-4}$ amp/cm could not be tolerated, and for other applications, a tenth of an amp would not be considered punch-through. For the 1.00 micron gate, the current punches through to about 1.0 amp/cm with the slightest voltage and rises to about 10 amp/cm at higher voltages. For the 1.1 micron gate, the current punches through at about 5 volts to about 0.1 amp/cm current and rises to about 1 amp/cm at higher voltages. For the 1.2 micron gate length, the punch through is not till about 15 volts and rises only to about a tenth of an amp/cm current for the voltages tested. For the longer gate lengths, a significant punch-through current was not reached at the tested voltages. For the device simulated, a typical gate length that might be selected would be about 1.15 microns.

A feature of the invention is that various ones of the interlayer dielectrics 77 (FIG. 3A), 41, 46, and 49 (FIG. 2) can be used to form the gate oxide for the ESD transistors. For example, in the PFET 12 in FIG. 2, the layers 46 and 49 are used, and for the NFET 70, layers 42 (and 77 also which is not shown in FIG. 2 for simplicity) 41, 46, and 49 are used. Simply by adjusting the masks in the conventional steps of the BiCMOS process, different interlayer dielectrics can be selected. In addition, various ones of the dopings used in conventional BiCMOS processes may be selected, also by adjusting the masks. For example, the N-type NPN collector doping which effects the punch-through threshold may or may not be selected. This ability to select different structures and processes permits the circuit designer to select any one of a wide variety of turn-on thresholds and punch-through thresholds and other device parameters.

It is a further feature of the invention that the source/drain contacts 44A, 44B, 48A, and 48B are made of polysilicon. In prior art devices, heat generated by high currents tended to travel along the surface 41 of the silicon layers and either cause melting or migration of the metal of the contacts into the silicon. The melting of the metal destroys the contacts, while the migration changes the silicon properties; both cause transistors to fail. Since the contacts are made of silicon, they melt only at a much higher temperature and migration of silicon to silicon is not a problem. Further, the metallization 53A, 53B, 52A and 52B is well removed from the interface of the contacts 44A, 44B, 48A, and 48B and the silicon surface 41, which protects them from the heat. Also, if the metal does migrate, it generally increases the conductivity of the polysilicon, which generally would not cause the device to fail.

Another feature of the invention is that the sources 24, 62 and drains 23, 63 of the thick-oxide FETs (emitters and collectors in bipolar mode), and the channels of the ESD transistors according to the invention, penetrate deeply into the silicon layers 30, 31, and 33. This increases the volume of doped silicon in which the current flows, thus decreasing heating and dissipating the heating that does occur over a larger area.

An additional feature of the invention is that the invention is that the highly doped outdiffusion areas 40A, 40B, 39A, 39B form the portion of the source/drains (emitters/collectors in bipolar mode) immediately adjacent the silicon surface 36. This is the region in which current flow is the highest, and the high doping in this area increases the conductivity and decreases the heating.

For the above reasons, the thick-oxide devices according to the invention can be much smaller than the conventional diodes used in bipolar technology and still handle larger voltages. The area in the integrated circuit 10 that a transistor such as 12, 70 occupies will of course vary depending on the current and voltage it is designed to handle; typically a transistor according to the invention that is designed to handle ESD charges of 6000 volts covers an area of about 10 to 100 square microns, as compared to the 400 square microns that the prior art diodes used. This 10 to 100 square micron area is also smaller than the thick oxide transistors used in the MOS technologies of the prior art.

Yet another feature of the invention is that the high conductivities and smaller size leads to a faster turn-on time for the transistors according to the invention as compared to devices that could handle comparable voltages and currents in the prior art. For the 10 to 100 square micron transistor that can handle 6000 volts, a typical turn-on time is on the order of 10–100 picoseconds as compared to on the order of several hundred picoseconds seconds for the prior art devices.

There has been described several novel embodiments of a thick-oxide ESD FET and a process for fabricating the FETs with conventional BiCMOS processes without utilizing any additional process steps, and which has many other advantages. As indicated above, the particular embodiments shown in the drawings and described within this specification are for purposes of example and should not be construed to limit the invention, which will be described in the claims below. For example, the wafer 10 could start with a P− type substrate, an N− substrate, an N+ substrate or other doping of the substrate most of which would lead to other dopings of the sources, drains, channels, collectors, emitters, bases, etc. Further, it is evident that those skilled in the art may now make numerous uses and modifications of the specific embodiment described, without departing from the inventive concepts. For example, now that it is seen to be possible to fabricate thick-oxide MOSFETs utilizing only the standard steps of the BICMOS process, many other implementations of ESD devices become evident. It is also evident that the steps recited may in some instances be performed in a different order. For example, the order of many of the various dopings could be altered. Or equivalent structures and process may be substituted for the various structures and processes described. Or a variety of different dimensions and materials may be used. Additional structures and process steps may be added. Consequently, the invention is to be construed as embracing each and every novel feature and novel combination of features present in and/or possessed by the integrated circuit structures and fabrication processes described.

What is claimed is:

1. An integrated circuit including an electrostatic discharge protection device, said integrated circuit including a pair of nodes between which an excess voltage is to be prevented, said electrostatic discharge protection device comprising:

a semiconductor region of one conductivity type having a first principal surface, first and second terminal regions of second conductivity type, extending from said first principal surface into and separated by said region of one conductivity type, said first and second terminal regions each having a deep region of said second conductivity type, spaced from said first principal surface, said deep regions each having a concentration of doping of said second conductivity type which has a maximum value at a depth spaced from said first principal surface, said deep regions also including portions above and below said depth which portions have concentrations of doping of said second conductivity type less than said maximum, said first and second terminal regions each having a shallow region of said second conductivity type extending from said first principal surface to contact the respective deep region of said second conductivity type, and a gate electrode overlying said first principal surface between said first and second terminal regions, said gate electrode separated from said first principal surface by an insulator layer, and at least one of said first and second terminal regions and said gate connected to one of said pair of nodes and at least another of said first and second terminal regions and said gate being connected to the other of said pair of nodes, whereby said electrostatic discharge protection device extends deeply from said first principal surface thereby increasing the volume of semiconductor through which current may flow during electrostatic discharge between said pair of nodes.

2. An integrated circuit as in claim 1 wherein said deep region comprises one or more deep implants.

3. An integrated circuit as in claim 1 wherein one of said nodes is an input/output line and the other of said nodes is the integrated circuit ground.

4. An integrated circuit as in claim 1 wherein said gate electrode and one of said terminal regions are connected.

5. An integrated circuit as in claim 4 wherein said connection between said gate electrode and said one of said first and second terminal regions comprises a polysilicon connector.

6. An integrated circuit as in claim 1 wherein said integrated circuit includes circuitry protected by said electrostatic discharge protection device and said circuitry includes a bipolar transistor.

7. An integrated circuit as in claim 6 wherein said circuitry includes a CMOS transistor.

8. An integrated circuit devise as in claim 1 wherein said electrostatic discharge protection device has an area of 100 square microns or less, can shunt up to 6000 volts, and has a turn-on time of 10 picoseconds or less.

\* \* \* \* \*